United States Patent
Rha

(10) Patent No.: US 6,376,893 B1
(45) Date of Patent: Apr. 23, 2002

(54) TRENCH ISOLATION STRUCTURE AND FABRICATION METHOD THEREOF

(75) Inventor: Kwan Goo Rha, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/638,866

(22) Filed: Aug. 15, 2000

Related U.S. Application Data

(62) Division of application No. 09/195,558, filed on Nov. 19, 1998, now Pat. No. 6,127,241.

(30) Foreign Application Priority Data

Dec. 13, 1997 (KR) .............................................. 97-68563

(51) Int. Cl.$^7$ ............................................ H01L 21/764
(52) U.S. Cl. ...................................... 257/522; 438/422
(58) Field of Search .................. 438/411, 412, 438/421, 422; 257/522

(56) References Cited

U.S. PATENT DOCUMENTS

| | | | |
|---|---|---|---|
| 4,169,000 A | 9/1979 | Raiseman | 438/422 |
| 4,356,211 A | 10/1982 | Raiseman | 438/422 |
| 5,098,856 A | 3/1992 | Beyer et al. | 438/422 |
| 5,668,398 A * | 9/1997 | Havemann et al. | 257/522 |
| 6,057,226 A | 5/2000 | Wong | 438/421 |
| 6,114,186 A * | 9/2000 | Jeng et al. | 438/623 |

OTHER PUBLICATIONS

Yamamoto et al., Ultrathin Amorphous C:H Overcoat by pCVD on Thin Film Media., 2000 IEEE, pp. 115–119.*

* cited by examiner

*Primary Examiner*—Olik Chaudhuri
*Assistant Examiner*—Anh Duy Mai
(74) *Attorney, Agent, or Firm*—Fleshner & Kim, LLP

(57) ABSTRACT

Trench isolation structure includes a first conformal insulating film (preferably consisting of silicon nitride) which lines a trench etched in a silicon substrate, an insulating layer (preferably consisting of silicon dioxide) which caps the lined trench and thereby forms a cavity, and a gas (preferably consisting of carbon dioxide) within the cavity. Fabrication of the trench isolation structure is begun by depositing a first conformal insulating film onto the surface of a trench etched in a silicon substrate, thereby forming a lined trench. An amorphous carbon layer is deposited within the lined trench and the lined trench is capped by an insulating layer which encloses the amorphous carbon within a cavity. The solid amorphous carbon within the cavity is converted to carbon dioxide gas by annealing the substrate in an oxidizing ambient. Planarizing the insulating layer to the level of the substrate completes fabrication of the trench isolation structure.

18 Claims, 7 Drawing Sheets

TRENCH ISOLATION STRUCTURE AND FABRICATION METHOD THEREOF

This application is a Divisional of application Ser. No. 09/195,558 filed Nov. 19, 1998 now U.S. Pat. No. 6,127,241.

BACKGROUND of THE INVENTION

1. Field of the Invention

The present invention relates to an isolation structure fabricated on the silicon substrate and more particularly, to a trench isolation structure fabricated on a silicon substrate and also to a method by means of which the trench isolation structure is fabricated.

2. Background of the Related Art

Various isolation structures have been proposed to prevent the establishment of parasitic electrical connections between adjacent devices of integrated circuits fabricated on silicon substrates. Since LOCOS(Local Oxidation of Silicon) is well-characterized, simple to implement, and resistant to contamination, LOCOS processes have been widely employed to fabricate isolation structures. As device geometries reached submicron size, however, conventional LOCOS isolation reached the limit of its effectiveness, since the bird's beak structure characteristic of conventional LOCOS field oxides causes unacceptably large encroachments of the field regions of the substrate into he substrate's active regions and the surface topography of LOCOS field oxides proves inadequate to the planarity requirements of submicron scale lithography.

Advanced LOCOS processes which suppress or entirely eliminate the formation of bird's beak have been used to fabricate isolation structures for both 64-Mbit and 256-Mbit DRAM arrays. However, the field oxides of even advanced LOCOS processes prove too large for utilization in Gbit DRAM arrays, which require memory cells whose gate lengths are shorter than 0.2 $\mu$m. Trench isolation structures have been widely employed to overcome the limitations inherent in LOCOS field oxides, primarily because trenches with vertical sidewalls may be made significantly narrower than LOCOS field oxides of the same depth and widths of such trenches are more easily controlled than the widths of LOCOS field oxides. Process steps of a typical method of fabricating a conventional trench isolation structure in a silicon substrate are described immediately below with reference to the idealized cross-sectional views of FIGS. 1A–1D. After a thin pad oxide has been thermally grown on or deposited by chemical vapor deposition (CVD) onto a silicon substrate 10 and a silicon nitride ($Si_3N_4$) deposited onto the pad-oxide, the oxide and the nitride are patterned by means of conventional photolithographic and etching process steps to form an oxide film 11 and a nitride film 12, respectively which together mask active (device, regions of the substrate. (The active regions are, by definition, the regions of the substrate masked by the oxide and nitride films, while the field regions are the regions of the substrate not so masked.) Trenches 13 are then selectively and anisotropically dry-etched in the field (isolation) regions of the substrate 10, as shown in FIG. 1A. As shown in FIG. 1B, a conformal oxide film 14 is deposited onto the nitride film and onto the walls and floor of the trenches 13. The areas of the oxide film 14 which line the trenches 13 serve to repair damage suffered by the substrate when the trenches were etched. As shown in FIG. 1C, a layer of amorphous $SiO_2$ (known also as fused silica, undoped silica glass, or silica glass) 16 is deposited by CVD onto the conformal oxide film 14 and within each of the trenches 13. Various other dielectrics, including CVD-polysilicons, may be used to refill the trenches. As shown in FIG. 1D, the silica glass layer 16 is etched-back until silica glass remains only within the lined trenches, thus completing fabrication or trench isolation structures 19, each of which the lined trenches, thus completing fabrication of trench isolation structures 19, each of which consists of an oxide trench liner 14a within each of the trenches 13 and a silica glass structure 16a within each of the trench liners 14a.

Although trench isolation structures, particularly those formed in deep, narrow trenches, overcome many of the limitations of LOCOS field oxides, methods of fabricating trench isolation on structures, as typified by the method described above, are not without drawbacks. For any trench width, trenches are more likely to be imperfectly formed and incompletely filled as the aspect ratio(i.e., the ratio of depth to width) of the trenches increases. For example, trench sidewall profiles must be strictly controlled to avoid void formation when the trenches are refilled with silica glass or other solid dielectric. Moreover, for any aspect ratio, formation of voids becomes more likely as the trenches become narrower than about 2 $\mu$m.

SUMMARY OF THE INVENTION

An object of the invention is to provide a trench isolation structure in which a gas, rather than a solid, is used as the dielectric within the trench, thus completely avoiding the problem of void formation inherent in refilling trenches with solid dielectrics. The trench isolation structure of the present invention includes a first conformal insulation film (preferably consisting of silicon nitride) which lines a trench etched in a silicon substrate, an insulation layer (preferably consisting of silicon dioxide) within the cavity.

The method of fabricating the trench isolation structure of the present invention begins with depositing a first conformal insulation film (preferably a silicon nitride film) onto surfaces of a trench etched in a silicon substrate, thereby forming a lined trench, followed by sputtering amorphous carbon into the lined trench. The lined trench is then capped by an insulating layer which, in conjunction with regions of the surfaces of the trench, encloses the amorphous carbon within a cavity. The amorphous carbon within the cavity is converted to carbon dioxide gas by furnace annealing the substrate in an oxidizing ambient. Planarizing the insulating layer to the substrate completes the isolation structure.

BRIEF DESCRIPTION OF THE DRAWINGS

None of the figures briefly described below are drawn to scale. As is common in the art of integrated circuit representation, the thicknesses and lateral dimensions of the various structures shown in the figures were chosen only to enhance the legibility of the figures.

FIGS. 1A–3D are idealized cross-sectional views showing process steps of a typical method of fabricating conventional trench isolation structures in a silicon substrate;

FIGS. 3A–3K are idealized cross-sectional views illustrating process steps Of a method of fabricating the trench isolation structures of FIGS. 2A–2C according to embodiments of the present invention;

DETAILED DESCRIPTION OF THE PREFERRED EMBODIMENT

Figure 2A:
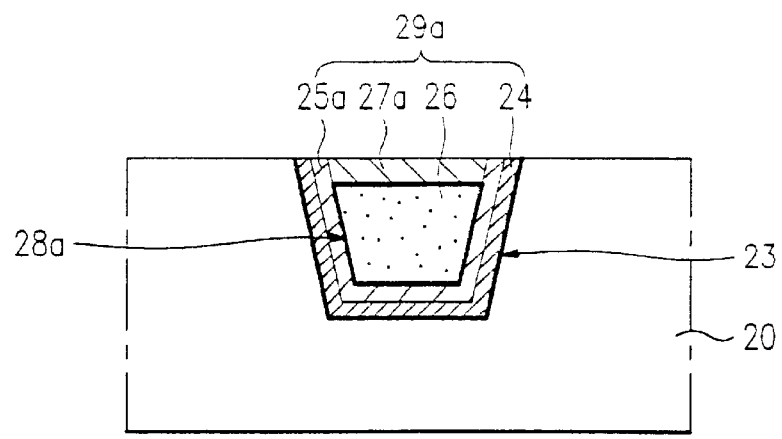
FIGS. 2A–2C are idealized cross-sectional views of trench isolation structures in a silicon substrate according to embodiments of the present invention.

According to a first embodiment of the trench isolation structure of the present invention, as shown in FIGS. 2A, a trench isolation structure 29a in a silicon substrate 20 having trench 23 includes; a first conformal insulation film 24 (preferably a silicon nitride film no thicker than 100 nm) which lines the trench and thereby defines a lined trench; a second conformal insulating film 25a (preferably; an undoped polysilicon film or a silicon dioxide film no thicker than 100 nm) on the first conformal insulating film 24; an insulating layer 27a (preferably a silicon dioxide laser no thicker than 50 nm) which caps he lined trench and thus defines a cavity 28a; and a gas 26 (preferably carbon dioxide gas) within the cavity 28a. Device fabrication process steps subsequent to fabrication of the structure described immediately above would clearly be facilitated were the insulation layer 27a, and thus the trench isolation structures of the present invention, planarized to the substrate (i.e, were the upper surface of the insulation layer 27a substantially coplanar with the upper surface of the original substrate), as shown in FIG. 2A.

Each of the elements of the embodiment of the present invention described immediately above corresponds to a structural element formed in a single process step of the fabrication method described in detail below. As shown in the idealized cross-sectional view of FIG. 2B, another embodiment of the present invention may be described as a trench 23 which has been etched in a silicon substrate 20 and is lined by a first conformal insulating film 24 (preferably a silicon nitride film no thicker than 100 nm), where an insulating layer 27b (preferably a silicon dioxide layer) which has a cavity 28a fills the lined trench and where a gas 26 (preferably carbon dioxide gas) fills the cavity 28a. The insulating layer 27b recited immediately above, which is not formed in a single process step of the fabrication method described in detail below, may be viewed as a combination of a second conformal insulating film 25a consisting of silicon dioxide and an insulating layer 27a also consisting of silicon dioxide, each of which is formed in a single process step of the fabrication method described in detail below.

Figure 2B:
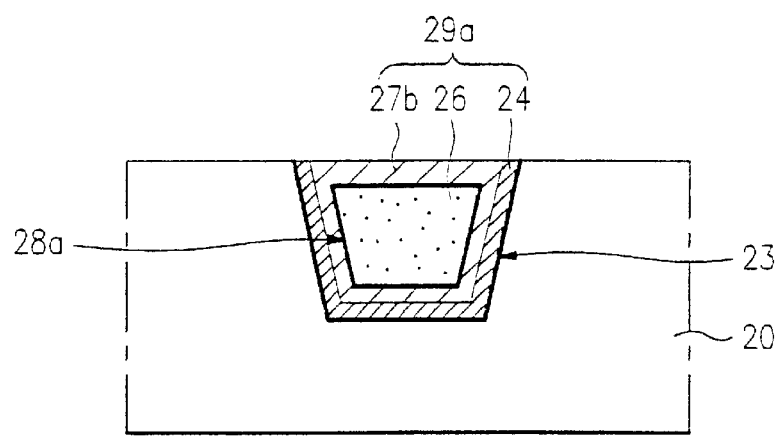
Figure 2C:
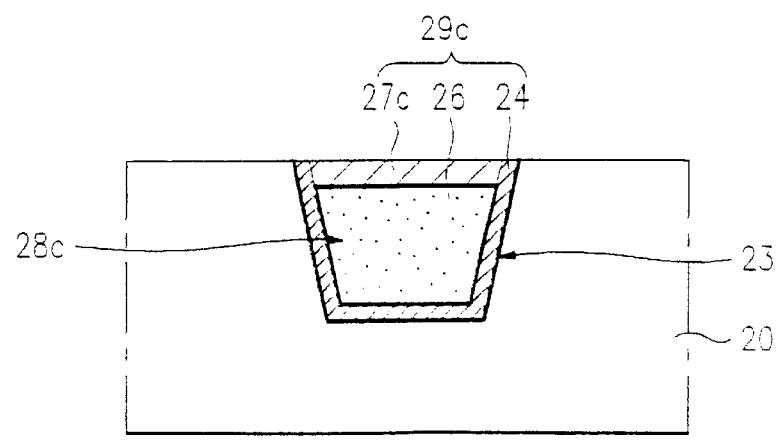

According to another embodiment of the trench isolation structure of the present invention, as shown in FIG. 2C, a trench isolation structure 29c in a silicon substrate 20 having a trench 23 includes; a first conformal insulating film 24 (preferably a silicon dioxide layer no thicker than 50 nm) which caps the lined trench and thus defines a cavity 28c; and a gas 26 (preferably carbon dioxide gas) Within the cavity 28c. As for the first embodiment described above, subsequent process steps to fabricate devices in the active regions of the substrate would be facilitated were the insulating layer 27c planarized to the substrate, as shown in FIG. 2C.

Process steps of a method of fabricating the trench isolation structures shown in FIGS. 2A–2C are described below with reference to the idealized cross-sectional views of FIGS. 3A–3K. After thin, 20–60 nm, pad-oxide has been thermally grown on or CVD-deposited onto a silicon substrate 30, 100–200 nm of silicon nitride ($Si_3N_4$) is CVD-deposited onto the pad oxide.

Figure 3A:
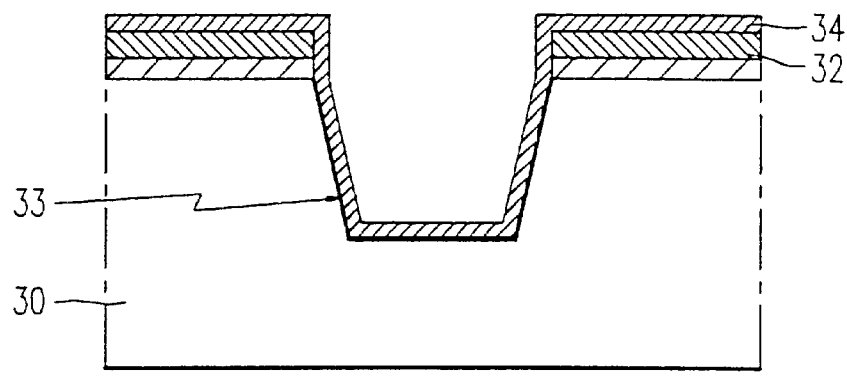
Figure 3B:
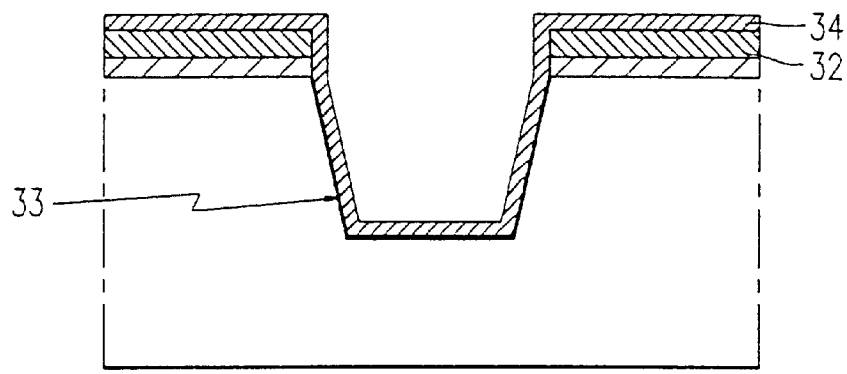
Figure 3C:
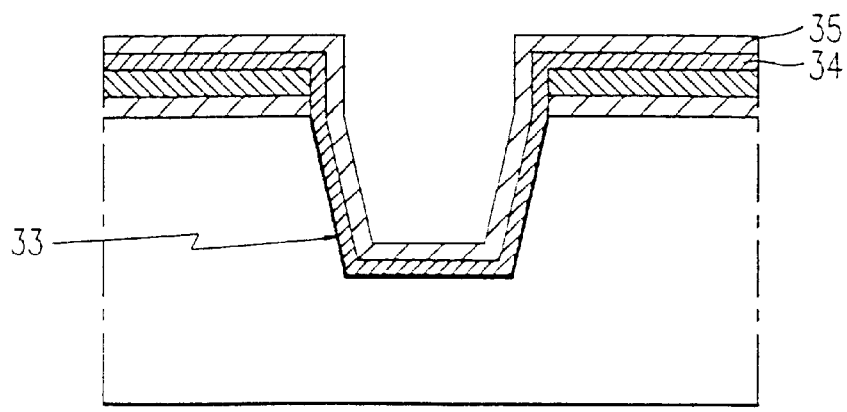
Figure 3D:
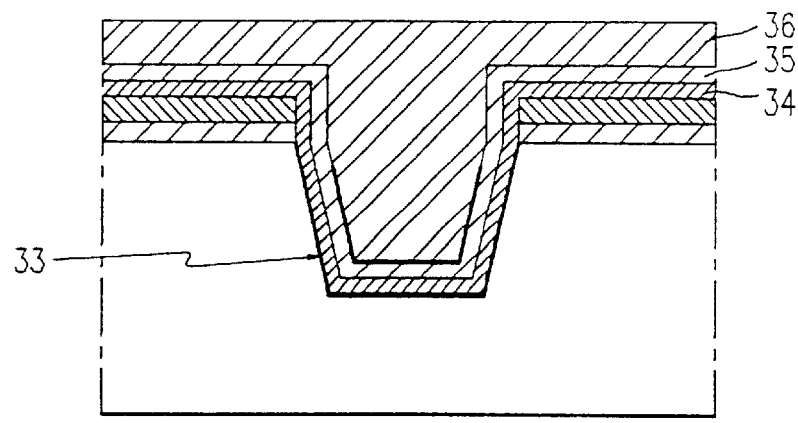
Figure 3E:
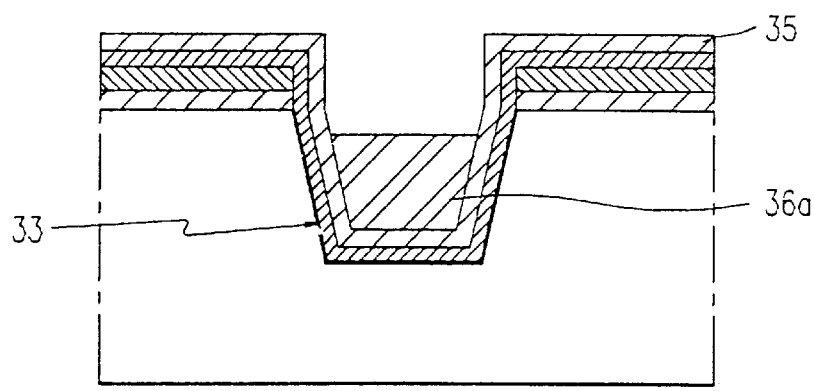
Figure 3F:
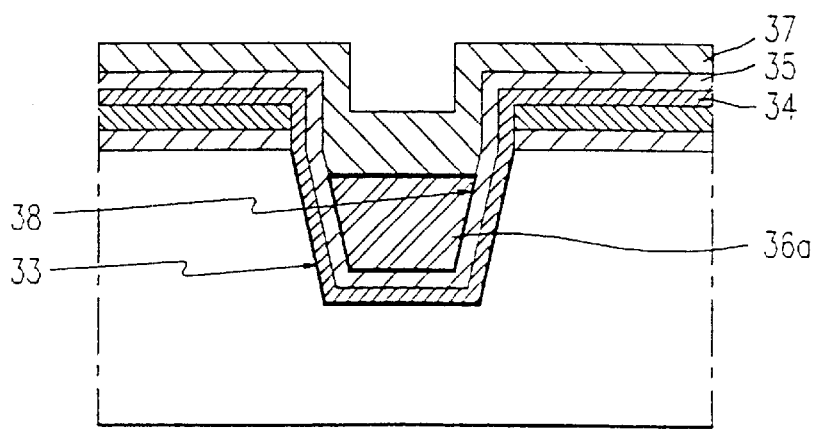
Figure 3G:
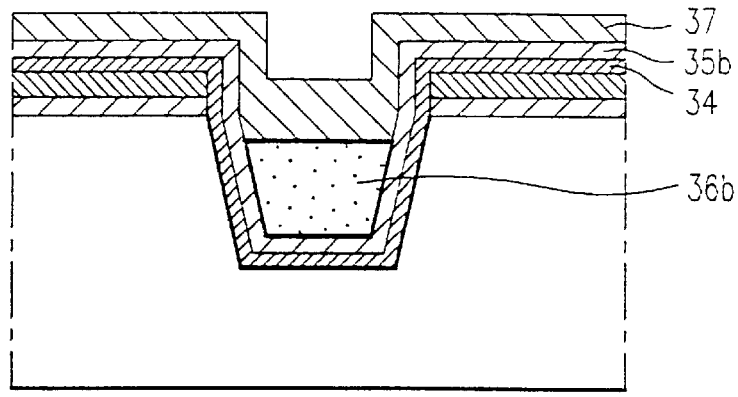

The pad-oxide and the nitride are patterned by means of well-known photolithographic and etching process steps to form an oxide film 31 and a nitride film 32, respectively, which together mask active regions of the substrate. Trenches 33 are them selectively and anisoptropically dry-etched (preferably by means of reactive ion etching) in the field regions of the substrate 30, as shown in FIG. 3A. As shown in FIG. 3B, a first conformal insulating film 34 (preferably a silicon nitride film on thicker than 100 nm) is deposited onto the nitride film 32 and onto the surfaces (i.e, the walls and floor) of each of the trenches 33 (preferably by means of high-temperature, low-pressure CVD), thereby lining each of the trenches. A nitride film is preferred as the trench liner because silicon nitride is essentially impervious to both water vapor and molecular oxygen, while high-temperature, low-pressure CVD is preferred as the deposition method to ensure conformality. As shown in FIG. 3C, a second conformal insulating film 34 (preferably a silicon nitride film no thicker than 100 nm) is deposited onto the nitride film 32 and onto the surfaces (i.e., the walls and floor) of each of the trenches 33 (preferably by means of high-temperature, low-pressure CVD), thereby lining each of the trenches. A nitride film is preferred as the trench liner because silicon nitride is essentially impervious to both water vapor and molecular oxygen, while high-temperature, low-pressure CVD is preferred as the deposition method to ensure conformality. As shown in FIG. 3C, a second conformal insulating film 35 (preferably an undoped polysilicon film or a silicon dioxide film no thicker than, 100 nm) is deposited onto the first conformal insulating film 34 (preferably by means of high-temperature, low-pressure CVD, again to ensure conformality) Alternatively omitting deposition of the second conformal insulating film 35 from the present sequence would finally yield the trench isolation structure shown in FIG. 2C, rather than the trench isolation structure shown in FIG. 2C, rather than the trench isolation structures shown in FIGS. 2A–2B. As shown in FIG. 3D, an amorphous carbon layer 36 is deposited (preferably by means of sputtering) onto the substrate and within each of the lined trenches. As shown in FIG. 3E, the amorphous carbon layer 36 is etched-back (preferably by means of reactive ion etching) until carbon remains only within the trenches, thereby forming an etched carbon layer 36a within each of the trenches. As shown in FIG. 3F, a thin, permeable insulating layer 37 (preferably a layer of silicon dioxide) is sputter-or CVD-deposited over the substrate to cab the trenches. Each etched carbon layer 36a is thus completely enclosed within a cavity 38a-bounded from above by a region of the permeable insulating layer 37, bounded laterally and from below by regions of the second conformal insulating film 35. If deposition of he second conformal insulating layer 35 were not included the process sequence, each etched carbon layer 36a would be bounded from above by a region of the permeable insulating layer 37 and bounded laterally and from below by regions of the first conformal insulating film 34. As the wafer is furnace-annealed at a temperature of at least 400° C. (preferably between 400° C. and 450° C.) in an oxidizing ambient, the oxidizing species ($O_2$ in a dry oxidation process, $H_2O$ in a wet oxidation process) diffuses through the permeable insulating layer 37 and reacts with carbon of the etched carbon layers 36a to form carbon dioxide ($CO_2$) gas 36b. The end point of the oxidation reaction within the cavity (i.e., the point at which the carbon of the etched amorphous carbon layers 36a may be safely assumed to have been completely converted into gaseous carbon dioxide) is monitored by means of oxide growth on a test strip on the substrate. (Alternatively, the furnace-anneal may be performed after the insulating layer 37 over the trenches has been planarized to the substrate.)

Figure 3H:
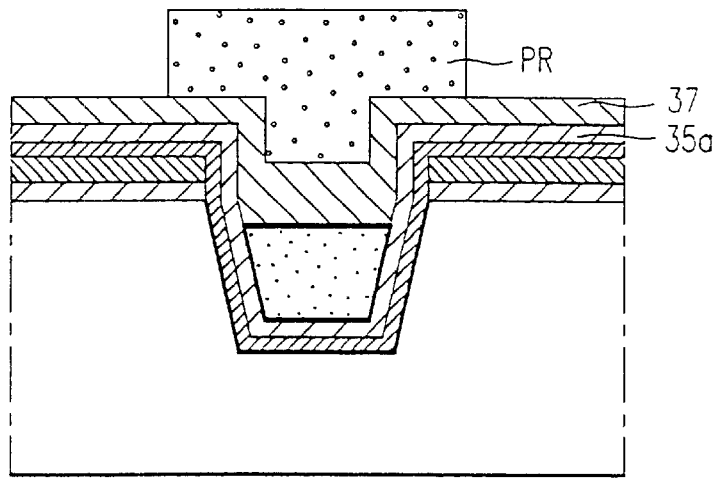

A silicon dioxide layer is preferred as the permeable insulating layer 37 which caps the trenches, because $O_2$, $H_2O$, and $CO_2$ all diffuse through silicon dioxide, the first of these albeit much more rapidly than the latter two. The thickness or, more appropriately, the thin-ness of the permeable insulating layer 37 is dictated primarily by the desirability of minimizing the diffusive transport time of $CO_2$ and either $O_2$ or $H_2O$ across the layer.) Where deposition of the second conformal insulating film 35 is included in the precess sequence. Where deposition of the second conformal insulating film 35 is included in the process sequence. It is preferable that the permeable insulating layer 37 and the second conformal insulating film 35 both consist of the same material in order to minimize the number of subsequent process steps and also to maximize the adhesion of the permeable insulating layer 37 to the second conformal insulating film 35. Regions of the first conformal insulating film 34 which line the trenches prevent $O_2$, $H_2O$, and $CO_2$ from diffusing from the cavities 38a into the substrate 30 during the anneal. Excess carbon dioxide gas escapes from the cavities 38a by diffusing back through the permeable insulating layer 37 to the ambient. After a photoresist coating has been spun onto the wafer, a photoresist pattern PR which masks the permeable insulating layer 37 above the trenches 33 is formed by means of well-known exposure and development process steps, as shown in FIG. 3H.

Figure 3I:
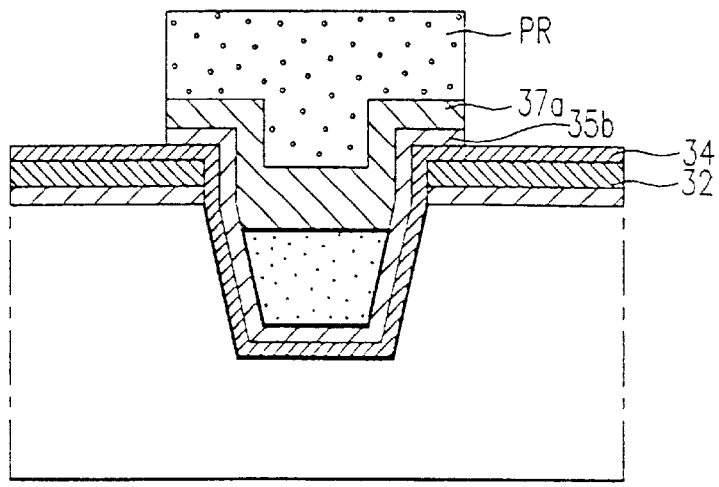
Figure 3J:
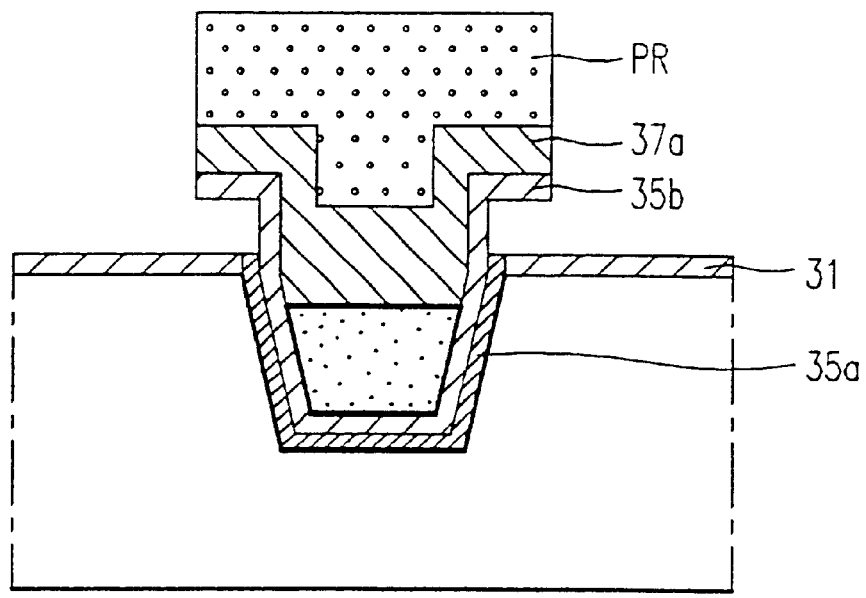
Figure 3K:
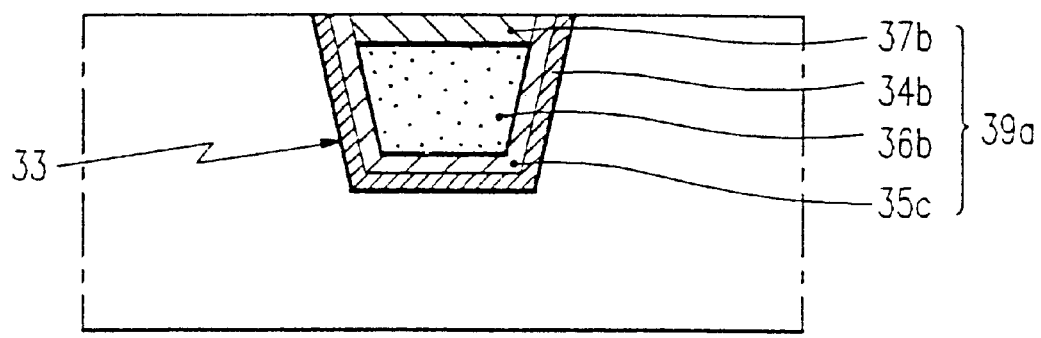

Masked by the photoresist pattern PR, the permeable insulating layer 37 and the second conformal insulating film 35a to either side of each of the trenches are selectively and anisotropically dry-etched, thereby forming an etched permeable insulating layer 37a and an etched second conformal insulating film 35b above each of the trenches, as shown in FIG. 3I. (The permeable insulating layer 37 and the second conformal insulating film 35a may be etched by means of a single etching system where both consist of silicon dioxide. If both aren't oxides, then different etching systems would probably be required to sequentially etch both, with a consequent increase in process complexity.) As shown in FIG. 3J, the first conformal insulating film 34 and the nitride film 32 are selectively and isotropically wet-etched to either side of each of the trenches 33, thereby forming etched first conformal insulating films 34a which line the trenches. (The first conformal insulating film 34 and the nitride film 32 may be etched by means of a single etching system where both consist of silicon nitride. If both films aren't nitrides, then different etching systems would probably be required to sequentially etch these films.) After the photoresist pattern PR has been stripped, the pad-oxide film 31, the etched second conformal insulating film 35b, and the etched permeable insulating layer 37a outside each of the trenches 33 are removed by means of either reactive ion etching or wet-etching with HF or $NH_4F$ thus planarizing the trench isolation structures to the substrate, as shown in FIG. 3K. (The pad-oxide film 31, the etched second conformal film 35b, and the etched permeable insulating layer 37a may be etched by means of a single etching system where all three consist of silicon dioxide, which is clearly a powerful argument in favor of forming all three from silicon dioxide.)

Etching thus completes the fabrication of trench isolation structures 39a according to the present invention, each of which includes; a first conformal insulating film 34b which lines a trench 33 in a semiconductor substrate 30 and thereby defines a lined trench; a second conformal insulating film 35c on the first conformal insulating film 34b; a permeable insulating layer 37b which caps the lined trench and thereby defines a cavity 38a; and a carbon dioxide gas 36c within the cavity 38a. If deposition of a second conformal insulating film were not included in the process sequence, etching would complete the fabrication of trench isolation structures 29c, each of which would include; a first conformal insulating film 24 which lines a trench 23 in a semiconductor substrate 20 and thereby defines a lined trench; a permeable insulating layer 27b which caps the lined trench and thereby defines a cavity 28b; and a carbon dioxide gas 26 within the cavity.

Figure 1A:
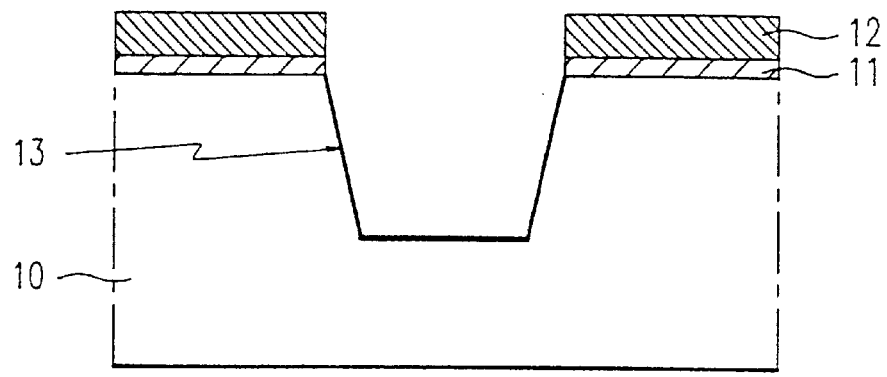
Figure 1B:
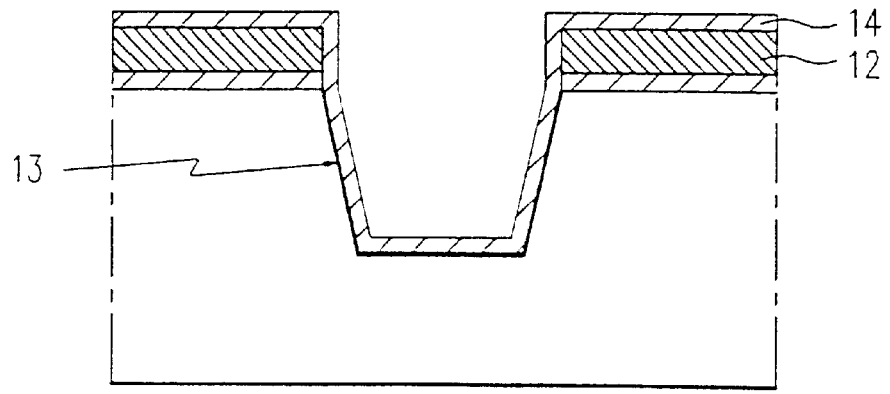
Figure 1C:
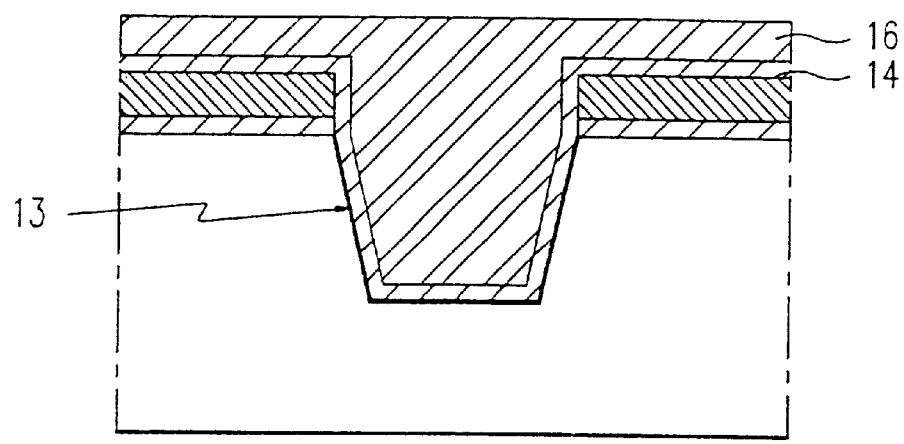
Figure 1D:
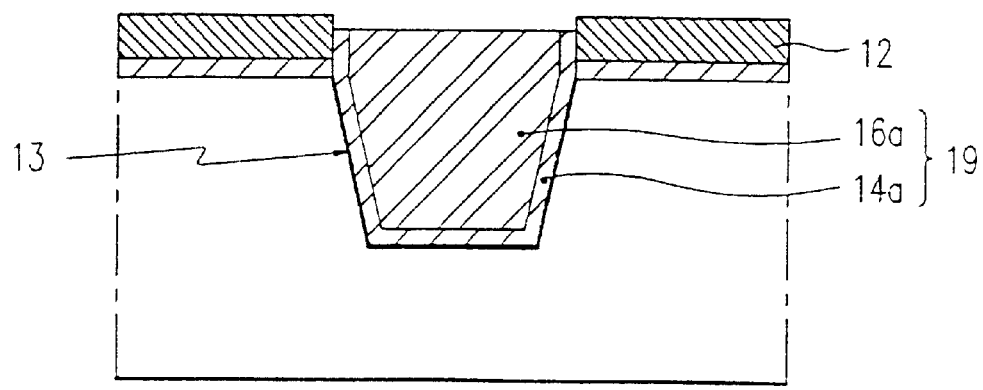

The trench isolation structures of the present invention, as shown in FIG. 2A–2C, exhibit a singular advantage over trench isolation structures disclosed in the prior are, as typified by the structure illustrated in FIG. 1D. Parasitic capacitive coupling between the substrate and inter connect runners above the isolation structures is from two-to five-times less than it would have been had the dielectric in the trenches been silicon dioxide rather than carbon dioxide gas, since the relative dielectric constant of the gas 1 while that of silicon dioxide is 2~5 (the exact value depends of the manner of formation of the dielectric). The method of the present invention of fabricating such structures minimizes the impact of many of the problems associate d with forming trenches and sidesteps all of the problems associated with refilling the trenches with a solid dielectric.

It will be apparent to those skilled in the art that various modifications may be made to the trench isolation structure of the present intention and to the method by which the structure is fabricated without departing from the spirit of the invention. The present invention is thus intended to cover such modifications provided they fall within the scope of the appended claims an their equivalents.

What is claimed is:

1. A trench isolation structure in a silicon substrate, the substrate having a lined trench, the structure comprising:
   an insulating layer within the lined trench, the insulating layer completely enclosing a cavity; and
   a gas comprising $CO_2$ within the cavity.

2. The trench isolation structure according to claim 1, wherein the insulating layer is planarized to the substrate.

3. The trench isolation structure according to claim 1, wherein the insulating layer comprises $SiO_2$.

4. A trench isolation structure in a silicon substrate, the substrate having, a trench, the structure comprising:
   a first conformal insulating film lining the trench, thereby defining a lined trench;
   insulating layer within the lined trench, the insulating layer having a cavity; and
   a gas comprising $CO_2$ within the cavity.

5. The trench isolation structure according to claim 4, wherein the insulating layer is planarized to the substrate.

6. The trench isolation structure according to claim 4, wherein the first conformal insulating film comprises $Si_3N_4$, and the insulating layer comprises $SiO_2$.

7. A trench isolation structure in a silicon substrate, the substrate having a trench, the structure comprising:
   a first conformal insulating film lining the trench, thereby defining a lined trench;
   an insulating layer capping the lined trench, thereby defining a cavity; and
   a as comprising $CO_2$ within the cavity.

8. The trench isolation structure according to claim 7, wherein the insulating layer is planarized to the substrate.

9. The trench isolation structure according to claim 7, wherein the first conformal insulating film comprises $Si_3N_4$, and the insulating layer comprises $SiO_2$.

10. The trench isolation structure according to claim 8, wherein the first conformal insulating film comprises $Si_3N_4$, and the insulating layer comprises $SiO_2$.

11. A trench isolation structure, comprising:
    a trench formed in a substrate;
    a first insulating layer lining the trench; and
    a second insulating layer capping the trench, and defining a cavity inside the trench; and
    a gas comprising $CO_2$ within the cavity.

12. The trench isolation structure of claim 11, wherein said first insulating layer and said second insulating layer are planarized to a substrate.

13. The trench isolation structure of claim 11, wherein said first insulating layer and said second insulating layer comprise the same material.

14. The trench isolation structure of claim 11, wherein said first insulating layer comprises $SiO_2$.

15. A trench isolation structure, comprising:
   a trench formed in a substrate;
   a first insulating layer lining the trench;
   a second insulating layer disposed on top of said first insulating layer; and
   a third insulating layer capping the trench, and defining a cavity inside the trench; and trench; and
   a gas comprising $CO_2$ within the cavity.

16. The trench isolation structure of claim 15, wherein said second insulating layer is planarized to said substrate.

17. The trench isolation structure of claim 15, wherein said second insulating layer and said third insulating layer comprise the same material.

18. The trench isolation structure of claim 15, wherein said first insulating layer comprises $Si_3N_4$ and said second insulating layer comprises $SiO_2$.

* * * * *